(12) United States Patent
Chow et al.

(10) Patent No.: US 9,809,883 B2
(45) Date of Patent: Nov. 7, 2017

(54) FORMALDEHYDE FREE ELECTROLESS COPPER PLATING COMPOSITIONS AND METHODS

(71) Applicant: Rohm and Haas Electronic Materials LLC, Marlborough, MA (US)

(72) Inventors: Andy Lok-Fung Chow, Fanling (CN); Dennis Kwok-Wai Yee, Fanling (CN); Crystal P. L. Li, Fanling (CN)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 247 days.

(21) Appl. No.: 14/796,459

(22) Filed: Jul. 10, 2015

(65) Prior Publication Data
US 2015/0376795 A1      Dec. 31, 2015

Related U.S. Application Data

(62) Division of application No. 13/769,332, filed on Feb. 17, 2013, now Pat. No. 9,611,550.

(60) Provisional application No. 61/746,112, filed on Dec. 26, 2012.

(51) Int. Cl.
| | |
|---|---|
| *H01B 1/02* | (2006.01) |
| *C23C 18/40* | (2006.01) |
| *C09D 1/00* | (2006.01) |
| *H05K 3/18* | (2006.01) |

(52) U.S. Cl.
CPC .............. *C23C 18/40* (2013.01); *C09D 1/00* (2013.01); *H05K 3/187* (2013.01); *H01B 1/02* (2013.01)

(58) Field of Classification Search
CPC ...................................................... H01B 1/02
See application file for complete search history.

(56) References Cited

U.S. PATENT DOCUMENTS

| | | |
|---|---|---|
| 3,649,350 A | 3/1972 | Agens |
| 3,864,148 A | 2/1975 | Maeawa et al. |
| 4,265,943 A | 5/1981 | Goldstein et al. |
| 4,684,550 A | 8/1987 | Milius et al. |
| 4,818,286 A | 4/1989 | Jagannathan et al. |
| 5,302,278 A | 4/1994 | Nobel et al. |
| 5,562,760 A | 10/1996 | Ballard et al. |
| 5,750,018 A * | 5/1998 | Brasch ............... C25D 3/38 106/1.26 |
| 6,046,107 A | 4/2000 | Lee et al. |
| 6,462,228 B1 | 10/2002 | Dams |
| 6,534,117 B1 | 3/2003 | Yoshio et al. |
| 7,473,307 B2 | 1/2009 | Song et al. |
| 7,501,014 B2 | 3/2009 | Poole et al. |
| 7,611,569 B2 | 11/2009 | Poole et al. |
| 2003/0113576 A1* | 6/2003 | Chebiam ............ C23C 18/34 428/670 |
| 2003/0183120 A1 | 10/2003 | Itabashi et al. |
| 2004/0253450 A1 | 12/2004 | Seita et al. |
| 2009/0188804 A1 | 7/2009 | Knop et al. |
| 2012/0145554 A1* | 6/2012 | Liu ...................... C23C 18/161 205/187 |

FOREIGN PATENT DOCUMENTS

| | | |
|---|---|---|
| EP | 0627021 B1 | 12/1994 |
| EP | 1411147 A1 | 4/2004 |
| EP | 1876259 A2 | 9/2008 |
| EP | 1876260 A2 | 9/2008 |
| EP | 1876261 A1 | 9/2008 |
| EP | 1876262 A1 | 9/2008 |
| FR | 824356 A | 2/1938 |
| FR | 1066000 A | 6/1954 |
| JP | 2008174774 | 1/2007 |
| JP | 4599599 | 12/2010 |
| KR | 101017692 B1 | 2/2011 |
| PL | 133956 | 7/1986 |
| RU | 2167113 C2 | 10/2001 |

OTHER PUBLICATIONS

Corresponding Office Action with Search Report dated Aug. 10, 2015.
Corresponding Office Action with Reference list dated Jan. 13, 2015.
Budanov, et al, "Electrochemical modeling of the kinetics of electroless deposition of nickel and copper by reduction of their salts with derivatives of hydoxy-and aminoalkylsulfinic acids", Russian Journal of General Chemistry, 2000, vol. 70, No. 5; pp. 659-662.
Terskaya et al, "Preparation of stable copper dispersions by redox reactions of Cu(II) salts with sulfur-containing reducing agents and properties of the dispersions," Russian Journal of Applied Chemistry, 2003, vol. 76, No. 6; pp. 871-874.
Akbarov et al, "Role of the chemical nature of the polymer substrate in formation of current-conducting structures in gel fibers", Khimicheskie volokna, 1990, No. 1; pp. 18-20.
Akbarov et al, "Development of electroconductive polyacrylonitrile fibers through chemical metallization and galvanisation," Journal of Applied Electrochemistry, 2006, vol. 36; pp. 411-418.
Terskaya et al, "Chemical glass nickel plating withsulfur-containing reducing agents," Chemistry and Chemical Technology, 2007, vol. 50, No. 2; pp. 41-44.
Ermolina et al, "Kinetics of reduction of Cu(II) with sodium hydroxymethylsulfinate and thiourea dioxide", Khim. i. khimicheskaya tekhnologiya, 1993, vol. 36, No. 6.
Terskaya et al, "Electroless nickel and copper plating of carbon fibers with the use of sulfur-containing reducing agents", Russian Journal of Applied Chemistry, 2004, vol. 77, No. 2; pp. 236-240.
Li et al, "The acceleration of nonformaldehyde electroless copper plating", Journal of the Electrochemical Society, 2002, vol. 149(12); pp. C631-C636.
S.V. Makarov, "Recent trends in the chemistry of sulfur-containing reducing agents," Russian Chemical Reviews, 2001, vol. 70(10); pp. 885-895.
Akbarov et al, "Photometric spectrum study of component interaction in solution for chemical metallization," Proceedings of Higher Eduction Institutions Chemistry and Chemical Technology, 1987, vol. 30(3).
European Search Report of corresponding European Application No. 13 19 9394 dated Apr. 24, 2014.

\* cited by examiner

*Primary Examiner* — William Young
(74) *Attorney, Agent, or Firm* — John J. Piskorski

(57) ABSTRACT

The copper electroless baths are formaldehyde free and are environmentally friendly. The electroless copper baths include one or more sulfinate compounds as reducing agents to replace formaldehyde. The electroless baths are stable and deposit a bright copper on substrates.

1 Claim, No Drawings

FORMALDEHYDE FREE ELECTROLESS COPPER PLATING COMPOSITIONS AND METHODS

FIELD OF THE INVENTION

The present invention is directed to formaldehyde free electroless copper plating compositions and methods. More specifically, the present invention is directed to formaldehyde free electroless copper plating compositions and methods which are stable, provide uniform copper deposits and are environmentally friendly.

BACKGROUND OF THE INVENTION

Electroless copper plating baths are used in metallization industries for depositing copper on various types of substrates. For example, in the manufacture of printed wiring boards the electroless copper baths are used to deposit copper into through-holes and circuit paths as a base for subsequent electrolytic copper plating. Electroless copper plating is also used in the decorative plastics industry for deposition of copper onto non-conductive surfaces as a base for further plating of copper, nickel, gold, silver and other metals. Typical baths which are in commercial use today contain divalent copper compounds, chelating agents or complexing agents for the divalent copper ions, formaldehyde reducing agents and various addition agents to make the bath more stable, adjust the plating rate and brighten the copper deposit. Although many of such baths are successful and are widely used, the metallization industry has been searching for alternative electroless copper plating baths that do not contain formaldehyde due to its toxic nature.

Formaldehyde is known as an eye, nose and upper respiratory tract irritant. Animal studies have shown that formaldehyde is an in vitro mutagen. According to a WATCH committee report (WATCH/2005/06—Working group on Action to Control Chemicals—sub committee with UK Health and Safety Commission) over fifty epidemiological studies have been conducted prior to 2000 suggested a link between formaldehyde and nasopharyngeal/nasal cancer but were not conclusive. However, more recent studies conducted by IARC (International Agency for Research on Cancer) in the U.S.A. showed that there was sufficient epidemiological evidence that formaldehyde causes nasopharyngeal cancer in humans. As a result the INRS, a French agency, has submitted a proposal to the European Community Classification and Labelling Work Group to reclassify formaldehyde from a category 3 to a category 1 carcinogen. This would make usage and handling of it more restricted, including in electroless copper formulations. Accordingly, there is a need in the metallization industry for a comparable or improved reducing agent to replace formaldehyde. Such a reducing agent must be compatible with existing electroless copper processes; provide desired capability and reliability and meet cost targets.

Hypophosphites have been used as a replacement for formaldehyde, such as in U.S. Pat. No. 4,265,943; U.S. Pat. No. 5,562,760; U.S. Pat. No. 6,046,107; and U.S. Pat. No. 6,534,117; however, hypophosphites do not possess catalytic function on the copper surface. This problem is addressed by the addition of extra mediator metal ions, such as nickel(II) and cobalt(II), to the plating bath. However, the copper deposit from such baths is not sufficiently conductive for many electronic applications.

Glyoxylic acid is another reducing agent which has been used to replace formaldehyde. Glyoxylic acid is similar in structure to formaldehyde but its oxidation potential is more positive than formaldehyde. An example of a copper bath which includes glyoxylic acid as a reducing agent is U.S. Pat. No. 7,473,307. However, glyoxylic acid is much more expensive than formaldehyde and it decomposes quickly. Glyoxylic acid requires a strong alkaline environment to function as a reducing agent because of its acidic nature. Readily obtainable and conventional alkaline compounds, such as sodium hydroxide are not suitable for adjusting the pH due to the formation of insoluble sodium oxalate as a by-product. Such a by-product shortens the lifespan of the plating bath. Accordingly, the more expensive base potassium hydroxide is typically used to adjust the alkalinity to the desired pH of at least 12. All of the above features discourage the use of glyoxylic acid as a reducing agent for electroless copper baths.

Boron containing compounds such as dimethylamine borane, sodium borohydride and ammonium tetra(n)-butylboranhydride have also been tried as reducing agents with various degrees of success. Examples are disclosed in U.S. Pat. No. 4,684,550; and U.S. Pat. No. 4,818,286. Unfortunately, these reducing agents are very expensive and associated with health and safety hazards. Resultant borates have adverse effects on crops and dimethylamine borane is generally toxic.

Accordingly, there is still a need for an electroless copper bath which is free of formaldehyde and is both stable, provides acceptable copper deposits and is environmentally friendly.

SUMMARY OF THE INVENTION

Compositions include one or more sources of copper ions, one or more chelating agents and one or more sulfur containing reducing agents having formula:

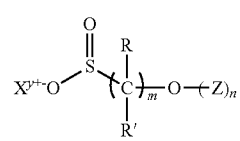

where $X^{y+}$ is a neutralizing counter cation of formula (I), where y+ is an integer of one or greater and $X^{y+}$ may be $H^+$, ammonium cation, quaternary ammonium cation, sulfonium cation, phosphonium cation, pyridinium cation, monovalent metal cation, multivalent metal cation, alkaline-earth cation or divalent organometallic cation; R and R' are independently hydrogen, hydroxy, hydroxyalkyl, alkoxy, alkoxyalkyl, cyano, halide, haloalkyl, ester, thiol, thiol ester, carboxyl, carboxyalkyl, sulfonate, sulfoxide, substituted, unsubstituted, linear or branched alkyl, substituted, unsubstituted, linear or branched alkynyl, amino, amine, amide, sulfinate; substituted or unsubstituted aryl; Z may be hydrogen, substituted, unsubstituted, linear or branched alkyl, substituted, unsubstituted, linear or branched alkenyl, allyl, acetyl or substituted or unsubstituted aryl; m is an integer of 0 to 6 with the proviso that when m is 0 a covalent bond is formed between the S and O of $-O-(Z)_n$, and n is an integer of 0 or 1, when n=0 the oxygen carries a negative charge.

Methods include providing a substrate; and electrolessly depositing copper on the substrate using an electroless copper composition including one or more sources of copper ions, one or more chelating agents and one or more sulfur containing reducing agents having formula:

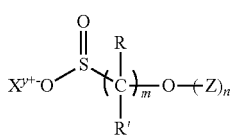

(I)

wherein $X^{y+}$ is a neutralizing counter cation of formula (I), where y+ is an integer of one or greater and $X^{y+}$ may be $H^+$, ammonium cation, quaternary ammonium cation, sulfonium cation, phosphonium cation, pyridinium cation, monovalent metal cation, multivalent metal cation, alkaline-earth cation or divalent organometallic cation; R and R' are independently hydrogen, hydroxy, hydroxyalkyl, alkoxy, alkoxyalkyl, cyano, halide, haloalkyl, ester, thiol, thiol ester, carboxyl, carboxyalkyl, sulfonate, sulfoxide, substituted, unsubstituted, linear or branched alkyl, substituted, unsubstituted, linear or branched alkynyl, amino, amine, amide, sulfinate; substituted or unsubstituted aryl; Z may be hydrogen, substituted, unsubstituted, linear or branched alkyl, substituted, unsubstituted, linear or branched alkenyl, allyl, acetyl or substituted or unsubstituted aryl; m is an integer of 0 to 6 with the proviso that when m is 0 a covalent bond is formed between the S and O of $-O-(Z)_n$; and n is an integer of 0 or 1, when n=0 the oxygen carries a negative charge.

Methods also include providing a printed wiring board including a plurality of through-holes; desmearing the through-holes; and depositing copper on walls of the through-holes using an electroless copper composition including one or more sources of copper ions, one or more chelating agents and one or more sulfur containing reducing agents having formula:

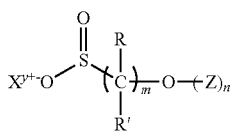

(I)

wherein $X^{y+}$ is a neutralizing counter cation of formula (I), where y+ is an integer of one or greater and may be $H^+$, ammonium cation, quaternary ammonium cation, sulfonium cation, phosphonium cation, pyridinium cation, monovalent metal cation, multivalent metal cation, alkaline-earth cation or divalent organometallic cation; R and R' are independently hydrogen, hydroxy, hydroxyalkyl, alkoxy, alkoxyalkyl, cyano, halide, haloalkyl, ester, thiol, thiol ester, carboxyl, carboxyalkyl, sulfonate, sulfoxide, substituted, unsubstituted, linear or branched alkyl, substituted, unsubstituted, linear or branched alkynyl, amino, amine, amide, sulfinate; substituted or unsubstituted aryl; Z may be hydrogen, substituted, unsubstituted, linear or branched alkyl, substituted, unsubstituted, linear or branched alkenyl, allyl, acetyl or substituted or unsubstituted aryl; m is an integer of 0 to 6 with the proviso that when m is 0 a covalent bond is formed between the S and O of $-O-(Z)_n$; and n is an integer of 0 or 1 when n=0 the oxygen carries a negative charge.

The aqueous based electroless copper compositions are formaldehyde free thus they are environmentally friendly. The environmentally friendly electroless copper plating compositions are stable during storage as well as during copper deposition. Additionally, the environmentally friendly electroless copper baths provide uniform copper deposits which may have a uniform pink and smooth appearance, and generally have good backlight performance. The aqueous electroless copper compositions also plate copper at commercially acceptable rates and inhibit the formation of copper oxide ($Cu_2O$) in the bath. Copper oxide is readily formed in many formaldehyde free conventional electroless copper plating solutions at high pH ranges. Such copper oxide formation destabilizes the electroless copper and copper alloy compositions and inhibits the deposition of copper and copper alloys on substrates. The inhibition of the copper oxide formation enables the autocatalytic process to operate at high pH ranges where copper and copper alloy deposition is thermodynamically favorable.

DETAILED DESCRIPTION OF THE INVENTION

As used throughout this specification, the abbreviations given below have the following meanings, unless the context clearly indicates otherwise: g=gram; mg=milligram; mL=milliliter; L=liter; cm=centimeter; m=meter; mm=millimeter; μm=micron; min.=minute; ppm=parts per million; ° C.=degrees Centigrade; wt %=percent by weight; and $T_g$=glass transition temperature.

The terms "printed circuit board" and "printed wiring board" are used interchangeably throughout this specification. The terms "plating" and "deposition" are used interchangeably throughout this specification. All amounts are percent by weight, unless otherwise noted. All numerical ranges are inclusive and combinable in any order except where it is logical that such numerical ranges are constrained to add up to 100%.

Electroless copper compositions are formaldehyde free and are environmentally friendly. The compositions are aqueous based and can provide a copper deposit with a uniform salmon pink appearance and good backlight plating results. In general the compositions are stable during storage and sufficiently stable during plating to provide acceptable to good copper deposits on substrates.

The electroless copper compositions include one or more sources of copper ions, one or more chelating agents and one or more water soluble sulfur containing reducing agents having formula:

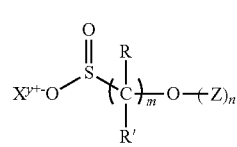

(I)

where $X^{y+}$ is a neutralizing counter cation of formula (I), where y+ is an integer of one or greater and $X^{y+}$ may be $H^+$, ammonium cation, quaternary ammonium cation, sulfonium cation, phosphonium cation, pyridinium cation, monovalent metal cation, multivalent metal cation, alkaline-earth cation or divalent organometallic cation; R and R' are independently hydrogen, hydroxy, hydroxyalkyl such as hydroxyl ($C_1$-$C_6$)alky, alkoxy, alkoxyalkyl such as alkoxy($C_1$-$C_6$) alkyl, cyano, halide, haloalkyl, such as a halo($C_1$-$C_6$)alkyl, ester, thiol, thiol ester, carboxyl, carboxyalkyl such as carboxy($C_1$-$C_6$)alkyl, sulfonate, sulfoxide, substituted, unsubstituted, linear or branched alkyl such as ($C_1$-$C_{12}$)alkyl, substituted, unsubstituted, linear or branched alkynyl such as ($C_2$-$C_{12}$)alkynyl, amino, amine such as a primary, secondary or tertiary amine, amide, sulfinate; substituted or unsubstituted aryl such as ($C_6$-$C_{18}$)aryl; Z may be hydrogen, substituted, unsubstituted, linear or branched alkyl such as ($C_1$-$C_{12}$)alkyl, substituted, unsubstituted, linear or branched alkenyl such as a ($C_2$-$C_{12}$)alkenyl, allyl such as ($C_2$-$C_{12}$) allyl, acetyl or substituted or unsubstituted aryl such as ($C_6$-$C_{18}$)aryl; m is an integer of 0 to 6 with the proviso that when m is 0 a covalent bond is formed between the S and O of —O—$(Z)_n$; and n is an integer of 0 or 1 when n=0 the oxygen carries a negative charge. Preferably n=1. Formula (I) is neutral in charge, thus the net negative charge of the anion component must equal the net positive charge of $X^{y+}$ or the moles of $X^{y+}$ are in sufficient amount to neutralize the net negative charge of the moles of the anion component of formula (I). Preferably $X^{y+}$ is $H^+$, ammonium cation, a monovalent metal cation, a multivalent metal cation or alkaline-earth cation, more preferably $X^{y+}$ is $H^+$, ammonium cation, or a monovalent cation and even more preferably $X^{y+}$ is $H^+$ or a monovalent cation. Preferably y+ is 1 or 2, more preferably y+ is 1. Preferably R and R' are independently hydrogen, linear or branched ($C_1$-$C_6$)alkyl, primary, secondary or tertiary amine, amide or sulfinate. More preferably R and R' are independently hydrogen, linear or branched ($C_1$-$C_6$)alkyl, primary or secondary amine or sulfinate. Even more preferably R and R' are independently hydrogen, linear or branched ($C_1$-$C_6$)alkyl, primary amine or sulfinate and most preferably R and R' are hydrogen, ($C_1$-$C_6$)alkyl or primary amine. Preferably Z is hydrogen, substituted, unsubstituted, linear or branched ($C_1$-$C_6$)alkyl, ($C_2$-$C_{12}$) alkenyl, acetyl or substituted or unsubstituted ($C_6$-$C_{10}$)aryl. More preferably Z is hydrogen, substituted or unsubstituted, linear or branched ($C_1$-$C_6$)alkyl, acetyl or substituted or unsubstituted ($C_6$-$C_{10}$)aryl. Even more preferably Z is hydrogen, substituted or unsubstituted, linear or branched ($C_1$-$C_6$)alkyl, or substituted or unsubstituted ($C_6$-$C_{10}$)aryl. Most preferably Z is hydrogen, substituted or unsubstituted, linear or branched ($C_1$-$C_6$)alkyl. Preferably, m is an integer from 1 to 6, more preferably from 1 to 5 and even more preferably from 1 to 3 and most preferably m is 1. The water soluble reducing agents are included in the compositions in amounts from 0.1 g/L to 100 g/L, preferably from 1 g/L to 80 g/L, more preferably from 2 g/L to 60 g/L, most preferably from 2 g/L to 30 g/L.

Monovalent metal cations include, but are not limited to $Li^+$, $Na^+$, $K^+$, $Rb^+$ and $Cs^+$. Preferably the monovalent cations are chosen from $Na^+$ and $K^+$. Multivalent cations include, but are not limited to $Be^{2+}$, $Mg^{2+}$, $Ca^{2+}$, $Sr^{2+}$ and $Ba^{2+}$. Preferably the multivalent cations are chosen from $Mg^{2+}$ and $Ca^{2+}$. More preferably the cations are $Na^+$ and $K^+$.

Quaternary ammonium cations include, but are not limited to tetraalkyl quaternary ammonium cations. Such cations include, but are not limited to tetramethyl ammonium cation, tetra(n-butyl)ammonium cation and tetraethyl ammonium cation.

Organometallic cations include, but are not limited to 2,2'-bipyridyl cations such as [Cu(2,2'-bypyridyl)$_2$]$^+$, [Cu(2,2'-bipyridyl)$_2$]$^{2+}$ and [Ni(2,2'-bipyridyl)$_2$]$^{2+}$.

Substituent groups include, but are not limited to hydroxyl, carbonyl, carboxyl, primary, secondary and tertiary amines, carboxy, cyano, nitro, amino, halide, sulfonyl, sulfonate, silfinate, sulfinyl, thiol, aryl, and amide. Preferably the substituent groups are hydroxyl, carbonyl, carboxyl, cyano, nitro, halide and thiol. More preferably the substituent groups are hydroxyl, carbonyl, carboxyl, nitro, halide and thiol. Most preferably the substituent groups are hydroxyl, carbonyl, carboxyl, halide and thiol. Halides include chloride, bromide, fluoride and iodide. Preferably the halide is chloride, bromide and fluoride. More preferably the halide is chloride and fluoride and most preferably the halide is chloride.

Sources of copper ions include, but are not limited to, water soluble halides, nitrates, acetates, sulfates and other organic and inorganic salts of copper. Mixtures of one or more of such copper salts may be used to provide copper ions. Examples are copper sulfate, such as copper sulfate pentahydrate, copper chloride, copper nitrate, copper hydroxide and copper sulfamate. Conventional amounts of copper salts may be used in the compositions. Sources of copper ions may be included in the compositions in amounts from 0.2 g/L to 30 g/L or such as from 0.5 g/L to 20 g/L or such as from 1 g/L to 10 g/L.

Chelating agents are preferably chosen from one or more of saccharides, such as monosaccharides and disaccharides; polycarboxylic acids and salts thereof and polyaminocarboxylic acids and salts thereof. Monosaccharides include, but are not limited to D-mannitol, xylitol and D-sorbitol, disaccharides include, but are not limited to sucrose, polyaminocarboxylic acids and salts thereof include, but are not limited to ethylenediaminetetraacetic acid, ethylenediaminetetraacetic acid sodium dibasic and ethylenediaminetetraacetic acid sodium tetrabasic, polycarboxylic acids and salts thereof include, but are not limited to citric acid, succinic acid, tartaric acid, Rochelle salts which include mixtures of sodium and potassium tatrate, and potassium tartrate. Preferably the chelating agents are ethylenediaminetetraacetic acid, ethylene diamine tetraacetic acid sodium dibasic, Rochelle salts, potassium tartrate, sucrose and D-mannitol, more preferably the chelating agents are ethylenediaminetetraacetic acid, ethylene diamine tetraacetic acid sodium dibasic, Rochelle salts and potassium tartrate, and most preferably the chelating agents are chosen from Rochelle salts and potassium tartrate. Such chelating agents are included in the compositions in amounts from 5 g/L to 150 g/L, preferably from 10 g/L to 100 g/L, more preferably 20 g/1 to 80 g/L and most preferably from 20 g/L to 60 g/L.

Alkaline compounds may be included in the electroless copper plating compositions to maintain a pH of 9 and higher. Conventional alkaline compounds may be included in the compositions such as alkali metal hydroxides such as sodium hydroxide, potassium hydroxide and ammonium hydroxide. Preferably sodium hydroxide or potassium hydroxide is used as the alkaline compound. Preferably the electroless copper plating compositions have a pH from 10 to 14, more preferably the electroless copper plating compositions have a pH from 11.5 to 13.6. Sufficient amount of alkaline compounds are included to maintain the desired pH. In general alkaline compounds are included in the electroless copper compositions in amounts from 4 g/1 to 100 g/1 or such as from 10 g/1 to 80 g/L.

Optionally, but preferably, the aqueous electroless copper compositions include one or more stabilizers. Such compounds may stabilize the electroless copper compositions by providing rate control, refine grain structure and modify deposit stress and prolong the life of the compositions during storage or during plating, improve backlight performance or combinations thereof. Such stabilizers include, but are not limited to nitrogen containing compounds and sulfur containing compounds such as amines, alkanolamines, thioamides, azole compounds derivatives and salts thereof. Amines include, but are not limited to urea and guanidine hydrochloride. Alkanolamines include, but are not limited to ethanolamine, diethanolamine and triethanolamine. Thioamides include, but are not limited to thourea and its derivatives. Azole compounds include, but are not limited to thiazoles, imidazoles, oxazoles, isoxazoles, pyrazoles and derivatives and salts thereof. Preferably the azole compounds are chosen from benzothiazoles, benzoimidazoles, benzopyrazoles, benzoxazoles, benzisoxazoles and derivatives thereof. Preferably the stabilizers are alkanolamines and azole compounds. More preferably the stabilizers are chosen from benzothiazoles, derivatives and salts thereof. Most preferably the azole compounds are chosen from mercaptobenzothiazoles, derivatives and salts thereof. In general the stabilizers are included in the electroless copper compositions in amounts from 0.05 ppm to 1000 ppm, preferably from 0.1 ppm to 500 ppm, more preferably from 0.1 ppm to 100 ppm, even more preferably 0.1 ppm to 50 ppm and most preferably from 0.1 ppm to 10 ppm.

Optionally, one or more surfactants can be included in the electroless plating compositions. Conventional surfactants may be used. Such surfactants include ionic, non-ionic and amphoteric surfactants. Ionic surfactants include conventional anionic and cationic surfactants. Typically the surfactants are non-ionic. Examples of non-ionic surfactants are alkyl phenoxy polyethoxyethanols, polyoxyethylene polymers having from 20 to 150 repeating units and block copolymers of polyoxyethylene and polyoxypropylene. Surfactants may be used in conventional amounts. Typically surfactants are used in amounts of 0.5 g/L to 20 g/L or such as from 1 g/L to 10 g/L.

Although the aqueous electroless plating compositions are preferably copper electroless plating compositions, it is envisioned that one or more alloying metal may be included in the electroless plating compositions to deposit a copper alloy on a substrate. Such alloying metals include, but are not limited to nickel and tin. Examples of copper alloys include copper/nickel and copper/tin.

Sources of nickel ions include one or more conventional water soluble salts of nickel. Sources of nickel ions include, but are not limited to nickel sulfates and nickel halides. Sources of nickel ions may be included in the electroless alloying compositions in conventional amounts. Typically sources of nickel ions are included in amounts of 0.5 g/L to 10 g/L or such as from 1 g/1 to 5 g/L.

Sources of tin ions may include one or more conventional water soluble salts of tin. Sources of tin ions include, but are not limited to, tin sulfates, tin halides and organic tin sulfonates. Sources of tin ions may be included in the electroless compositions in conventional amounts. Typically sources of tin ions are included in amounts of 0.5 g/L to 10 g/L or such as 1 g/L to 5 g/L.

The aqueous electroless copper and copper alloy compositions may be used to deposit a copper or copper alloy on both conductive and non-conductive substrates. The electroless compositions may be used in many conventional methods known in the art for electroless plating on conductive and non-conductive substrates. Copper or copper alloy deposition may be done at temperatures at or below 70° C. Preferably plating is done at room temperature to 45° C. The substrate to be plated with copper or copper alloy is immersed in the electroless composition or the electroless composition is sprayed onto the substrate. Conventional plating times may be used to deposit the copper or copper alloy onto the substrate. Deposition may be done for 5 seconds to 30 minutes; however, plating times may vary depending on the thickness of the copper or copper alloy desired on the substrate. Copper and Copper alloy plating rates may range from 0.1 µm/15 minutes or higher, typically from 0.1 µm/15 minutes to 1 µm/15 minutes, more typically from 0.2 µm/15 minutes to 0.5 µm/15 minutes.

Substrates include, but are not limited to printed circuit boards. Such printed circuit boards include metal-clad and unclad boards with thermosetting resins, thermoplastic resins and combinations thereof, including fiber, such as fiberglass, and impregnated embodiments of the foregoing.

Thermoplastic resins include, but are not limited to acetal resins, acrylics, such as methyl acrylate, cellulosic resins, such as ethyl acetate, cellulose propionate, cellulose acetate butyrate and cellulose nitrate, polyethers, nylon, polyethylene, polystyrene, styrene blends, such as acrylonitrile styrene and copolymers and acrylonitrile-butadiene styrene copolymers, polycarbonates, polychlorotrifluoroethylene, and vinylpolymers and copolymers, such as vinyl acetate, vinyl alcohol, vinyl butyral, vinyl chloride, vinyl chloride-acetate copolymer, vinylidene chloride and vinyl formal.

Thermosetting resins include, but are not limited to, allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

The aqueous electroless copper and copper alloy compositions may be used to plate both low and high $T_g$ resins. Low $T_g$ resins have a $T_g$ below 160° C. and high $T_g$ resins have a $T_g$ of 160° C. and above. Typically high $T_g$ resins have a $T_g$ of 160° C. to 280° C. or such as from 170° C. to 240° C. High $T_g$ polymer resins include, but are not limited to, polytetrafluoroethylene (PTFE) and polytetrafluoroethylene blends. Such blends include, for example, PTFE with polypheneylene oxides and cyanate esters. Other classes of polymer resins which include resins with a high $T_g$ include, but are not limited to, epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

The aqueous electroless compositions also may be used to deposit copper or copper alloys on the walls of through-holes or vias of printed circuit boards. The electroless compositions may be used in both horizontal and vertical processes of manufacturing printed circuit boards. Conventional methods may be used to prepare the through-holes for copper and copper alloy plating.

Through-holes are formed in printed circuit boards by drilling or punching or any other method known in the art. After the formation of the through-holes, the boards are rinsed with water and a conventional organic solution to clean and degrease the board followed by desmearing the through-hole walls. Typically desmearing of the through-holes begins with application of a solvent swell.

Any conventional solvent swell may be used to desmear the through-holes. Solvent swells include, but are not limited to, glycol ethers and their associated ether acetates. Such solvent swells are well known in the art. Commercially available solvent swells include, but are not limited to CIRCUPOSIT™ HOLE PREP 3303, CIRCUPOSIT™ HOLE PREP 4120 and CIRCUPOSIT™ HOLE PREP 211 formulations available from Dow Advanced Materials, Marlborough, Mass.

Optionally, the through-holes are rinsed with water. A promoter may then be applied to the through-holes. Conventional promoters may be used. Such promoters include sulfuric acid, chromic acid or alkaline permanganate. Typically alkaline permanganate is used as the promoter. Examples of commercially available promoters are CIRCUPOSIT™ PROMOTER 4130 formulation and CIRCUPOSIT™ 213A-1 formulation from Dow Advanced Materials, Marlborough, Mass.

Optionally, the through-holes are rinsed again with water. A neutralizer may then be applied to the through-holes to neutralize any residues left by the promoter. Conventional neutralizers may be used. Typically the neutralizer is an aqueous acid solution containing one or more amines or a solution of 3 wt % peroxide and 3 wt % sulfuric acid. An example of a commercially available neutralizer is CIRCUPOSIT™ NEUTRALIZER 216-5 formulation. Optionally, the through-holes are rinsed with water and the printed circuit boards are dried.

After desmearing an acid or alkaline conditioner may be applied to the through-holes. Conventional conditioners may be used. Such conditioners may include one or more cationic surfactants, non-ionic surfactants, complexing agents and pH adjusters or buffers. Commercially available acid conditioners include, but are not limited to CIRCUPOSIT™ CONDITIONER 3320 and CIRCUPOSIT™ CONDITIONER 3328 formulations available from Dow Advanced Materials, Marlborough, Mass. Alkaline conditioners include, but are not limited to, aqueous alkaline surfactant solutions containing one or more quaternary amines and polyamines. Commercially available alkaline surfactants include, but are not limited to CIRCUPOSIT™ CONDITIONER 231, 3325 and 3327 formulations also available from Dow Advanced Materials. Optionally, the through-holes are rinsed with water after conditioning.

Conditioning is typically followed by microetching the through-holes. Conventional microetching compositions may be used. Microetching is designed to provide a micro-roughened copper surface on exposed copper such as inner-layers and surface to enhance subsequent adhesion of deposited electroless and electroplate. Microetches include, but are not limited to 60 g/L to 120 g/L sodium persulfate or sodium or potassium oxymonopersulfate and sulfuric acid (2%) mixture, or generic sulfuric acid/hydrogen peroxide. An example of a commercially available microetching composition includes CIRCUPOSIT™ MICROETCH 3330 formulation available from Dow Advanced Materials. Optionally, the through-holes are rinsed with water.

A conventional pre-dip may then be applied to the microetched through-holes. A commercially available pre-dip is CATAPOSIT™ 404 formulation available from Dow Advanced Materials. Optionally, the through-holes are rinsed with cold water.

A catalyst may then be applied to the through-holes. Any conventional catalyst may be used. The choice of catalyst depends on the type of metal to be deposited on the walls of the through-holes. Typically the catalysts are colloids of noble and non-noble metals. Such catalysts are well known in the art and many are commercially available or may be prepared from the literature. Examples of non-noble metal catalysts include copper, aluminum, cobalt, nickel, tin and iron. Typically noble metal catalysts are used. Noble metal colloid catalysts include, for example, gold, silver, platinum, palladium, iridium, rhodium, ruthenium and osmium. More typically, noble metal catalysts of silver, platinum, gold and palladium are used. Most typically silver and palladium are used. A commercially available catalyst is CATAPOSIT™ 44 palladium/tin catalyst available from Dow Advanced Materials. The through-holes optionally can be rinsed with water after application of the catalyst.

The walls of the through-holes are then plated with copper or copper alloy with an electroless composition as described above. Typically copper is plated on the walls of the through-holes. Plating times and temperatures are also described above.

After the copper or copper alloy is deposited on the walls of the through-holes, the through-holes are optionally rinsed with water. Optionally, anti-tarnish compositions may be applied to the metal deposited on the walls of the through-holes. Conventional anti-tarnish compositions may be used. The through-holes may optionally be rinsed by a hot water rinse at temperatures exceeding 30° C. and then the boards may be dried.

After the through-holes are plated with copper or copper alloy, the substrates may undergo further processing. Further processing may include conventional processing by photoimaging and further metal deposition on the substrates such as electrolytic metal deposition of, for example, copper, copper alloys, tin and tin alloys.

The aqueous electroless copper compositions are formaldehyde free thus they are environmentally friendly. The environmentally friendly electroless copper plating compositions are stable during storage as well as during copper deposition. Additionally, the environmentally friendly electroless copper baths provide uniform copper deposits which may have a uniform pink and smooth appearance, and generally have good backlight performance. The electroless copper compositions also plate copper at commercially acceptable rates and inhibit the formation of copper oxide ($Cu_2O$) in the bath. Copper oxide is readily formed in many formaldehyde free conventional electroless copper plating solutions at high pH ranges. Such copper oxide formation destabilizes the electroless copper and copper alloy compositions and inhibit the deposition of copper and copper alloys on substrates. The inhibition of the copper oxide formation enables the autocatalytic process to operate at high pH ranges where copper and copper alloy deposition is thermodynamically favorable.

The following examples are not intended to limit the scope of the invention but to further illustrate it.

Example 1

Two unclad epoxy/glass laminates with dimensions 5 cm×5 cm were provided by Sheng Yi. Each laminate was treated as follows:
1. The surface of each laminate was immersed in an aqueous bath containing 3% CIRCUPOSIT™ CONDITIONER 3320 formulation for 5 minutes at 40° C.
2. Each laminate was then rinsed with cold water for 4 minutes at 22° C.
3. CATAPOSIT™ 404 pre-dip was then applied to each laminate for 1 minute at room temperature.
4. The laminates were then activated for 5 minutes at 40° C. with a 2% CATAPOSIT™ 44 and CATAPOSIT™ 404 palladium/tin catalyst bath for electroless copper metallization.
5. The laminates were then rinsed with cold water for 2 minutes.
6. Each laminate was then immersed in an aqueous electroless copper plating composition having the formulation in the table below:

TABLE 1

| COMPONENT | AMOUNT |
| --- | --- |
| Copper (II) ions from copper sulfate pentahydrate | 6.5 g/L |
| Disodium ethylenediamine tetraacetate dihydrate | 28.5 g/L |
| Sodium hydroxymethanesulfinate | 0.4 g/L |
| Potassium hydroxide | 14 g/L |
| pH | 12.5 |

7. One laminate was copper plated for 15 minutes at 32° C. with air agitation and the other laminate was copper plated for 15 minutes at room temperature without air agitation. No copper oxide red precipitate was observed in either solution during copper deposition. The baths appeared stable.
8. Each copper plated laminate was then rinsed with cold water for 2 minutes.
9. Each copper plated laminate was then rinsed with deionised water for 1 minute.
10. Each copper plated laminate was then placed in a conventional laboratory convection oven and dried for 15 minutes at 100° C.
11. After drying, each copper plated laminate was placed in a conventional laboratory dessicator for 25 minutes or until it cooled to room temperature.
12. After drying each copper plated laminate was observed for the quality of the copper deposit. Each laminate had a salmon pink copper deposit.
13. The copper deposit was then etched from each laminate by immersion in an ammonium chloride buffer of pH 10 and 3% hydrogen peroxide solution. The resulting clear blue copper (II) solution was collected.
14. Several drops of 5% PAN indicator was added to the copper (II) solution, which was then titrated with 0.05M ethylenediamine tetraacetic acid solution. The volume in mL of the 0.05M ethylenediamine tetraacetic acid solution added was recorded.
15. The copper deposition rate was calculated with this formula:

$$[(0.05M)(V\ mL)(10^{-3})(63.546\ g/mole)](10^4)(1/8.94\ g/cm^3)(1/2\ S\ cm^2)\ \text{in units of}\ \mu m/(plating\ time)$$

where V=volume of 0.05M ethylenediamine tetraacetic acid, molecular weight of copper is 63.546 g/mole, 8.94 g/cm$^3$ is the density of copper and S=surface area of the laminate in cm$^2$ which was 5 cm×5 cm, $10^{-3}$ is the conversion factor of L to mL and $10^4$ is the conversion factor of cm to μm. The plating rate for the laminate plated at 32° C. was 0.17 μm/15 minutes and the plating rate for the laminate plated at room temperature was 0.18 μm/15 minutes. The plating rate for each bath was substantially the same.

Example 2

Five epoxy/glass laminates with a plurality of through-holes and dimensions 2 cm×3.2 cm were provided. Each laminate was prepared for electroless copper plating as follows:
1. The surface of each through-hole laminate was immersed in an aqueous bath of 11.5% CUPOSIT™ Z sweller and 12.5% CIRCUPOSIT™ HOLE PREP 211 formulation for 5 minutes at 75° C. Each laminate was then rinsed with cold water for 3 minutes at 22° C.
2. 15% CUPOSIT™ Z and 10% CIRCUPOSIT™ 213A-1 oxidizer was then applied to each through-hole laminate for 10 minutes at 80° C. Each oxidized laminate was then rinsed with cold water for 3 minutes at 22° C.
3. The oxidized through-hole laminates were rinsed in 5% CIRCUPOSIT™ NEUTRALIZER 216-5 aqueous neutralizer for 5 minutes at 40° C. The neutralized through-hole laminate was then rinsed in cold water for 3 minutes at room temperature.
4. The surface of each through-hole laminate was immersed in 3% CIRCUPOSIT™ CONDITIONER 3320 aqueous bath for 5 minutes at 40° C. The treated laminates were rinsed with cold water for 4 minutes at 22° C.
5. Each through-hole laminate was dipped in an acidic microetch bath containing 2% sulfuric acid and sodium persulfate with a concentration at 100 g/L for 1 minute and then rinsed with cold water for 3 minutes at 22° C.
6. CATAPOSIT™ 404 pre-dip was then applied to each laminate for 1 minute at room temperature.
7. The laminates were then primed for 5 minutes at 40° C. with 2% CATAPOSIT™ 44 and CATAPOSIT™ 404 catalyst bath for electroless copper metallization. The laminates were then rinsed with cold water for 2 minutes.
8. Each through-hole laminate was then immersed in one of the electroless copper plating compositions described below in Table 2.

TABLE 2

| Formula | Copper sulfate pentahydrate | Rochelle salt | Potassium tartrate dibasic | Sodium hydroxymethanesulfinate | KOH | pH |
| --- | --- | --- | --- | --- | --- | --- |
| 1 | 6.5 g/L | 24 g/L | — | 0.4 g/L | 7 g/L | 12.5 |
| 2 | 6.5 g/L | 48 g/L | — | 1.6 g/L | 7 g/L | 12.5 |
| 3 | 6.5 g/L | — | 28 g/L | 0.8 g/L | 7 g/L | 12.5 |
| 4 | 6.5 g/L | — | 28 g/L | 1.6 g/L | 7 g/L | 12.5 |
| 5 | 6.5 g/L | — | 28 g/L | 3.2 g/L | 7 g/L | 12.5 |

9. Copper deposition was done for 15 minutes at 32° C. No $Cu_2O$ red precipitate was observed during copper deposition. Each copper plated laminate was then rinsed with cold water for 2 minutes.

The plating rates for each formula were determined using the method described in Example 1 above. The copper plating rates for formulae 1-5 were 0.29 μm/15 min., 0.32 μm/15 min., 0.29 μm/15 min., 0.25 μm/15 min. and 0.42 μm/15 min., respectively. Although the laminate plated with copper from formulae 3 and 4 had a dark colored copper deposit, the copper deposits plated with formulae 1, 2 and 5 had a salmon pink copper deposit.

Example 3

Two epoxy/glass laminates with a plurality of through-holes and dimensions 2 cm×3.2 cm were provided. Each laminate was prepared for electroless copper plating as described in Example 2 above except that the electroless copper formulations were composed of the components disclosed in Table 3 below.

TABLE 3

| Formula | Copper sulfate pentahydrate | Rochelle salt | Potassium tartrate dibasic | Sodium hydroxymethanesulfinate | KOH | pH |
|---|---|---|---|---|---|---|
| 6 | 6.5 g/L | 48 g/L | — | 3.2 g/L | 7 g/L | 12.5 |
| 7 | 6.5 g/L | — | 28 g/L | 3.2 g/L | 7 g/L | 12.5 |

During copper plating formula 6 showed plate-out indicating some instability; however, the copper deposit on the laminate was salmon pink. The plating rate was determined to be 0.31 μm/15 min. The stability of formula 7 was better than that of formula 6 and also produced a salmon pink copper deposit on the laminate. The plating rate was determined to be 0.43 μm/15 min.

Each laminate was then sectioned laterally to expose the copper plated walls of the through-holes. Multiple lateral sections 1 mm thick were taken from the walls of the sectioned through-holes of each laminate to determine the through-hole wall coverage using the conventional European Backlight Grading Scale. The 1 mm sections were placed under a conventional optical microscope of 50× magnification. The quality of the copper deposit was determined by the amount of light that was observed under the microscope. If no light was observed the section was completely black and was rated a 5 on the backlight scale. If light passed through the entire section without any dark areas, this indicated very little to no copper metal deposition on the wall and the section was rated 0. If sections had some dark regions as wells as light regions, they were rated between 0 and 5. The sections plated with formula 6 had an average backlight value of 2.5 and the sections plated with formula 7 had an average backlight value of 3. The results indicated that the electroless copper formulations containing sodium hydroxymethanesulfinate with Rochelle salts and potassium tartrate dibasic were promising for electroless copper plating of printed circuit boards.

Example 4

An epoxy/glass laminate with a plurality of through-holes and dimensions 2 cm×3.2 cm was provided. The laminate was prepared for electroless copper plating as described in Example 2 above except that the electroless copper formulation was composed of the components disclosed in Table 4 below.

TABLE 4

| COMPONENT | AMOUNT |
|---|---|
| Copper sulfate pentahydrate | 6.5 g/L |
| Potassium tartrate dibasic | 28 g/L |
| Sodium hydroxymethanesulfinate | 3.2 g/L |
| KOH | 7 g/L |
| Guanidine hydrochloride | 2 ppm |
| pH | 12.5 |

Copper plating was done for 15 min. at 32° C. The bath appeared stable without any indication of plate-out. The copper deposit on the laminate was salmon pink. The plating rate was determined to be 0.4 μm/15 min.

The laminate was then sectioned laterally to expose the copper plated walls of the through-holes. Multiple lateral sections 1 mm thick were taken from the walls of the sectioned through-holes to determine the through-hole wall coverage using the conventional European Backlight Grading Scale. The 1 mm sections were placed under a conventional optical microscope of 50× magnification. The quality of the copper deposit was determined by the amount of light that was observed under the microscope. The sections plated with the formula in Table 4 had an average backlight value of 3.5 out of 5. The addition of the guanidine hydrochloride improved both the stability of the plating bath and the backlight results in comparison to formulations 6 and 7 in Example 3.

Example 5

The method of Example 4 was repeated except that 3 ppm triethanolamine was substituted for the guanidine hydrochloride. The plating rate was determined to be 0.37 μm/15 min. Although there was some indication of plate-out, the copper deposit was salmon pink and the average backlight value was 4.5 out of 5. The addition of triethanolamine provided additional improvement in backlight performance while providing a salmon pink copper deposit.

Example 6

The method of Example 4 was repeated except that 0.2 ppm sodium 2-mercaptobenzothiazole was substituted for the guanidine hydrochloride. The plating rate was determined to be 0.31 μm/15 min. The copper deposit had a dirty-red appearance; however the average backlight value was determined to be 4 out of 5. Although the copper deposit was a dirty-red as opposed to salmon pink, the backlight value was an improvement over those produced by formulae 6 and 7 of Example 3 and Table 4 of Example 4 above.

What is claimed is:
1. A method comprising:
   a) providing a printed wiring board comprising a plurality of through-holes;
   b) desmearing the through-holes; and
   c) depositing copper on walls of the through-holes using an electroless copper composition consisting of one or more sources of copper ions, one or more chelating agents selected from the group consisting of polycarboxylic acids, salts thereof, polyaminocarboxylic acids and salts thereof, water, optionally one or more stabilizers selected from the group consisting of amines, alkanolamines, thioamides, azoles and salts thereof, optionally one or more surfactants, and one or more reducing agents having formula:

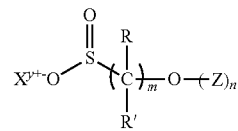

(I)

wherein $X^{y+}$ is a neutralizing counter cation of formula (I), where y+ is an integer of one or greater and $X^{y+}$ may be $H^+$, ammonium cation, quaternary ammonium cation, sulfonium cation, phosphonium cation, pyradinium cation, monovalent metal cation, multivalent metal cation or divalent organometallic cation;

R and R' are independently hydrogen, carboxyl, carboxyalkyl, sulfonate, sulfoxide, unsubstituted, linear or branched alkyl, sulfinate; substituted or unsubstituted aryl;

Z is chosen from unsubstituted, linear or branched ($C_1$-$C_6$)alkyl, acetyl or substituted or unsubstituted ($C_6$-$C_{10}$) aryl; m is an integer of 1 to 6; and n is 1; and the composition is free of formaldehyde.

* * * * *